United States Patent
Lee

(10) Patent No.: US 9,507,899 B2
(45) Date of Patent: Nov. 29, 2016

(54) SYSTEM AND METHOD FOR REGISTER TRANSFER LEVEL AUTOINTEGRATION USING SPREAD SHEET AND COMPUTER READABLE RECORDING MEDIUM THEREOF

(71) Applicant: SAMSUNG ELECTRONICS CO., LTD., Suwon-si (KR)

(72) Inventor: Jin-Won Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/618,381

(22) Filed: Feb. 10, 2015

(65) Prior Publication Data

US 2015/0254386 A1    Sep. 10, 2015

(30) Foreign Application Priority Data

Mar. 6, 2014  (KR) .......................... 10-2014-0026631

(51) Int. Cl.
*G06F 17/50* (2006.01)

(52) U.S. Cl.
CPC ................................. *G06F 17/5045* (2013.01)

(58) Field of Classification Search
CPC ................................................... G06F 17/5045
USPC ........................................ 716/101, 103, 104
See application file for complete search history.

(56) References Cited

U.S. PATENT DOCUMENTS

| | | | |
|---|---|---|---|
| 3,837,800 A * | 9/1974 | Wood | ........................ A61L 2/10 210/764 |
| 6,026,228 A | 2/2000 | Imai et al. | |
| 7,822,591 B2 | 10/2010 | Otsuki et al. | |
| 7,971,163 B2 | 6/2011 | Goto | |
| 9,251,293 B2 * | 2/2016 | Vyvyan | ............. G06F 17/30575 |
| 2006/0129368 A1 | 6/2006 | Smith et al. | |
| 2011/0067001 A1 | 3/2011 | Heintel et al. | |
| 2013/0111423 A1 | 5/2013 | Xia et al. | |

FOREIGN PATENT DOCUMENTS

| | | |
|---|---|---|
| JP | 2001-318956 A | 11/2001 |
| JP | 2006-171913 A | 6/2006 |
| JP | 2013-4066 A | 1/2013 |
| KR | 10-2005-0051207 A | 6/2005 |

* cited by examiner

*Primary Examiner* — Sun Lin
(74) *Attorney, Agent, or Firm* — Sughrue Mion, PLLC

(57) ABSTRACT

A system and a method for RTL auto-integration using a spread sheet and a recording medium thereof are provided. A method for RTL auto-integration including receiving an input indicating a connection relationship between a first device and a second device through a spread sheet, matching a first port included in the first device to a second port included in the second device using a naming matching algorithm, and converting the spread sheet into an RTL code using a result of the matching, wherein the naming matching algorithm matches the first port to the second port having a port name most similar to a first port name of the first port.

20 Claims, 14 Drawing Sheets

FIG. 6A

|   |   | k | i | t | t | e | n |
|---|---|---|---|---|---|---|---|
|   | 0 | 1 | 2 | 3 | 4 | 5 | 6 |
| s | 1 |   |   |   |   |   |   |
| i | 2 |   |   |   |   |   |   |
| t | 3 |   |   |   |   |   |   |
| t | 4 |   |   |   |   |   |   |
| i | 5 |   |   |   |   |   |   |
| n | 6 |   |   |   |   |   |   |
| g | 7 |   |   |   |   |   |   |

FIG. 6B

|   |   | k | i | t | t | e | n |
|---|---|---|---|---|---|---|---|
|   | 0 | 1 | 2 | 3 | 4 | 5 | 6 |
| s | 1 | 1 | 2 | 3 | 4 | 5 | 6 |
| i | 2 | 2 | 1 | 2 | 3 | 4 | 5 |
| t | 3 | 3 | 2 | 1 | 2 | 3 | 4 |
| t | 4 | 4 | 3 | 2 | 1 | 2 | 3 |
| i | 5 | 5 | 4 | 3 | 2 | 2 | 3 |
| n | 6 | 6 | 5 | 4 | 3 | 3 | 2 |
| g | 7 | 7 | 6 | 5 | 4 | 4 | 3 |

FIG. 9A

| Bus Postfix | Bus Component Instance Name | IP Instance Name | Postfix |
|---|---|---|---|
| S0 | | CPU | M0 |
| M0 | Memory Controller 1 | Memory 1 | S0 |
| M1 | Memory Controller 2 | Memory 2 | S0 |

FIG. 9B

| Source IP | Clock Source Port Name | Destination IP | IP Port Name |
|---|---|---|---|
| Clock Management Unit | CLK_CPU | CPU | CLK |
| | CLK_BUS | Bus | CLK |
| | CLK_MEMCON1 | Memory Controller 1 | CLK |
| | CLK_MEMCON2 | Memory Controller 2 | CLK |
| | CLK_MEM1 | Memory 1 | CK |
| | CLK_MEM2 | Memory 2 | CK |

FIG. 10A

```
module Example (
  ...
);

...

Bus u_Bus (
  //Bus signals
  .ARREADY_S0(wire_to_CPU_ARREADY_M0),
  .ARREADY_M0(wire_to_Memory_Controller_1_Ar_ready_s),
  .ARREADY_M1(wire_to_Memory_Controller_2_Ar_ready_s),
  ...
  //Clock
  .CLK(wire_to_Bus_CLK),
  ...
);

Clock_Management_Unit u_CMU (
  .CLK_CPU(wire_to_CPU_CLK),
  .CLK_BUS(wire_to_Bus_CLK),
  .CLK_MEMCON1(wire_to_Memory_Controller_1_CLK),
  .CLK_MEMCON2(wire_to_Memory_Controller_2_CLK),
  .CLK_MEM1(wire_to_Memory_1_CK),
  .CLK_MEM2(wire_to_Memory_2_CK),
  ...
);

CPU u_CPU (
  //Bus signals
  .ARREADY_M0(wire_to_CPU_ARREADY_M0),
  ...
  //Clock
  .CLK(wire_to_CPU_CLK),
  ...
);
```

```
Memory_Controller_1 u_Memory_Controller_1 (
  //Bus signals
  .Ar_ready_s(wire_to_Memory_Controller_1_Ar_ready_s),
  .Ar_ready_m(wire_to_Memory_1_ARREADY_S0),
  ...
  //Clock
  .CLK(wire_to_Memory_Controller_1_CLK),
  ...
);

Memory_Controller_2 u_Memory_Controller_2 (
  //Bus signals
  .Ar_ready_s(wire_to_Memory_Controller_2_Ar_ready_s),
  .Ar_ready_m(wire_to_Memory_2_ARREADY_S0),
  ...
  //Clock
  .CLK(wire_to_Memory_Controller_2_CLK),
  ...
);

Memory_1 u_Memory_1 (
  //Bus signals
  .ARREADY_S0(wire_to_Memory_1_ARREADY_S0),
  ...
  //Clock
  .CK(wire_to_Memory_1_CK),
  ...
);

Memory_2 u_Memory_2 (
  //Bus signals
  .ARREADY_S0(wire_to_Memory_2_ARREADY_S0),
  ...
  //Clock
  .CK(wire_to_Memory_2_CK),
  ...
);

...

endmodule
```

FIG. 11A

| Bus Postfix | Bus Component Instance Name | IP Instance Name | Postfix |
|---|---|---|---|
| S0 | | CPU | M0 |
| M0 | | New IP | S0 |
| M1 | Memory Controller | Memory | S0 |

| Source IP | Clock Source Port Name | Destination IP | IP Port Name |
|---|---|---|---|
| Clock Management Unit | CLK_CPU | CPU | CLK |
| | CLK_BUS | Bus | CLK |
| | CLK_MEMCON | Memory Controller | CLK |
| | CLK_MEM | Memory | CK |
| | CLK_NEWIP | New IP | CLK |

```
module Example (
  ...
);

...

Bus u_Bus (
  //Bus signals
  .ARREADY_S0(wire_to_CPU_ARREADY_M0),
  .ARREADY_M0(wire_to_New_IP_ARREADY_S0),
  .ARREADY_M1(wire_to_Memory_Controller_Ar_ready_s),
  ...
  //Clock
  .CLK(wire_to_Bus_CLK),
  ...
);

Clock_Management_Unit u_CMU (
  .CLK_CPU(wire_to_CPU_CLK),
  .CLK_BUS(wire_to_Bus_CLK),
  .CLK_MEMCON(wire_to_Memory_Controller_CLK),
  .CLK_MEM(wire_to_Memory_CK),
  .CLK_NEWIP(wire_to_New_IP_CLK),
  ...
);

CPU u_CPU (
  //Bus signals
  .ARREADY_M0(wire_to_CPU_ARREADY_M0),
  ...
  //Clock
  .CLK(wire_to_CPU_CLK),
  ...
);
```

```
Memory_Controller u_Memory_Controller (
  //Bus signals
  .Ar_ready_s(wire_to_Memory_Controller_Ar_ready_s),
  .Ar_ready_m(wire_to_Memory_ARREADY_S0),
  ...
  //Clock
  .CLK(wire_to_Memory_Controller_CLK),
  ...
);

Memory u_Memory (
  //Bus signals
  .ARREADY_S0(wire_to_Memory_ARREADY_S0),
  ...
  //Clock
  .CK(wire_to_Memory_CK),
  ...
);

New_IP u_New_IP (
  //Bus signals
  ARREADY_S0(wire_to_New_IP_ARREADY_S0),
  ...
  //Clock
  .CLK(wire_to_New_IP_CLK),
  ...
);

...

endmodule
```

SYSTEM AND METHOD FOR REGISTER TRANSFER LEVEL AUTOINTEGRATION USING SPREAD SHEET AND COMPUTER READABLE RECORDING MEDIUM THEREOF

CROSS-REFERENCE TO RELATED APPLICATION

This application claims priority from Korean Patent Application No. 10-2014-0026631, filed on Mar. 6, 2014 in the Korean Intellectual Property Office, the disclosure of which is incorporated herein in its entirety by reference.

BACKGROUND

1. Field

Apparatuses and methods consistent with exemplary embodiments relate to a system and a method for register transfer level (RTL) auto-integration using a spread sheet and a computer readable recording medium thereof.

2. Description of the Related Art

In general, design of a circuit that configures a specific device or system is performed in a manner that a register transfer level (RTL) design is prepared for a target circuit, functional verification of the target circuit is performed through simulation, the RTL design is changed to a gate level design through logic synthesis after completion of the RTL simulation, and verification of the gate level design is performed through the simulation.

In the related art, an RTL integration is performed using a direct coding method that is performed by a person in a one-by-one manner. However, an amount of data to be coded may be massive such that a skilled engineer needs to perform a coding task in a longer time period (e.g., more than one month) depending on a size of a system on chip (SOC). Also, even in the case of partially modifying the existing SOC that is previously designed, it may be difficult to reuse the existing RTL and thus the coding needs to be newly performed, which causes inconvenience to the user.

SUMMARY

One or more exemplary embodiments provide a method for a register transfer level (RTL) auto-integration, which may automate a simple repeated work using a spread sheet.

One or more exemplary embodiments also provide a system for RTL auto-integration, which may automate a simple repeated work using a spread sheet.

One or more exemplary embodiments also provide a computer readable recording medium recorded with a program to perform a method for RTL auto-integration, which may automate a simple repeated work using a spread sheet.

According to an aspect of an exemplary embodiment, there is provided a method for RTL auto-integration including receiving an input indicating a connection relationship between a first device and a second device through a spread sheet, matching a first port included in the first device to a second port included in the second device using a naming matching algorithm, and converting the spread sheet into an RTL code using a result of the matching, wherein the naming matching algorithm matches the first port to the second port having a port name most similar to a first port name of the first port.

According to an aspect of another exemplary embodiment, there is provided a system for RTL auto-integration including a processor, and a storage unit configured to store an RTL auto-integration module, which performs an operation using the processor, and data that is processed by the RTL auto-integration module, wherein the RTL auto-integration module includes a converter module configured to perform at least one of converting an RTL code corresponding to a first circuit into data of a spread sheet format and converting data included in a spread sheet into an RTL code, an interface module configured to present the data of the spread sheet format on the spread sheet and receive an input to modify a connection relationship between a first device and a second device, which are included in the first circuit through the spread sheet, and a matching module configured to match a first port included in the first device to a second port included in the second device using a naming matching algorithm.

According to an aspect of still another exemplary embodiment, there is provided a computer readable recording medium recorded with a program for performing a method for RTL auto-integration including receiving an input indicating a connection relationship between a first device and a second device storage device through a spread sheet, matching a first port included in the first device to a second port included in the second device using a naming matching algorithm, and converting the spread sheet into an RTL code using a result of the matching, wherein the naming matching algorithm matches the first port to the second port having a port name most similar to a first port name of the first port.

According to an aspect of still another exemplary embodiment, there is provided a system for designing a circuit using register transfer level (RTL) coding, the system including: at least one memory operable to store program code; and at least one processor operable to read the program code and operate as instructed by the program code, wherein the program code is configured to cause the at least one processor to: convert a first RTL code corresponding to a first circuit into a spread sheet indicating a connection relationship between devices included in the first circuit; and modify the spread sheet to correspond to a second RTL code, which is different from the first RTL.

BRIEF DESCRIPTION OF THE DRAWINGS

The above and/or other will be more apparent from the following detailed description of exemplary embodiments taken in conjunction with the accompanying drawings, in which:

FIGS. 6A and 6B are diagrams illustrating an LD algorithm of a method for RTL auto-integration according to an exemplary embodiment;

FIGS. 9A and 9B are diagrams illustrating spread sheets according to exemplary embodiments;

FIGS. 10A and 10B are diagrams illustrating RTL codes obtained using spread sheets in FIGS. 9A and 9B, respectively, according to exemplary embodiments;

FIGS. 11A and 11B are diagrams illustrating spread sheets according to other exemplary embodiments;

FIGS. 12A and 12B are diagrams illustrating RTL codes obtained using spread sheets in FIGS. 11A and 11B, respectively, according to other exemplary embodiments.

DETAILED DESCRIPTION

Figure 1:
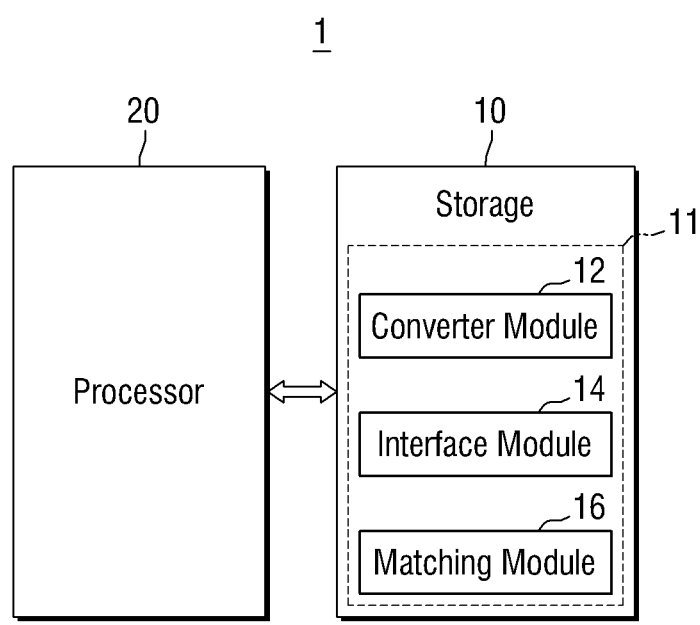
FIG. 1 is a diagram illustrating the configuration of a system for RTL auto-integration according to an exemplary embodiment.

Advantages and features of exemplary embodiments may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a diagram illustrating the configuration of a system for register transfer level (RTL) auto-integration according to an exemplary embodiment.

Referring to FIG. 1, a system 1 for RTL auto-integration according to an exemplary embodiment includes a processor 20 and a storage 10. The storage 10 may store an RTL auto-integration module 11 that performs an operation using the processor 20 and data that is processed by the RTL auto-integration module 11. For example, the storage 10 may store data of a spread sheet format into which an RTL code 130 (see FIG. 2) is converted or the RTL code 130 that is regenerated by the RTL auto-integration module 11. However, the exemplary embodiments are not limited thereto. The processor 20 may execute a program and control the RTL auto-integration system 1. The processor 20 may be a central processing unit (CPU). The processor 20 may be packaged into a semiconductor device or a semiconductor package.

The RTL auto-integration module 11 may include a converter module 12, an interface module 14, and a matching module 16.

Figure 2:
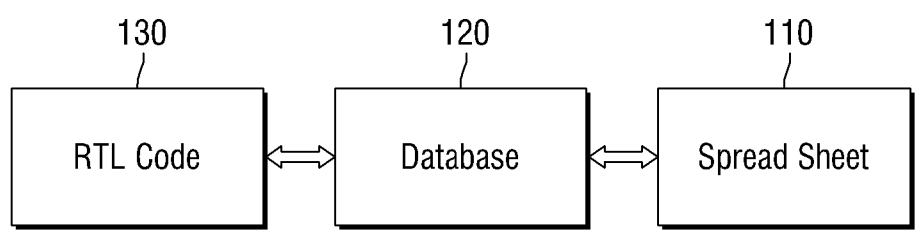
FIG. 2 is a diagram illustrating a method for RTL auto-integration according to an exemplary embodiment.

The converter module 12 may convert the RTL code 130 that corresponds to an existing first circuit into a spread sheet 110 (see FIG. 2). For example, the RTL code 130 may be converted into data of a spread sheet format that may be applied to the spread sheet 110. The data of the spread sheet format may appear on the spread sheet 110. For example, the converter module 12 may provide a database 120 (FIG. 2) through analysis of the existing RTL code 130, and automatically generate the spread sheet 110 using the database 120. The spread sheet 110, the database 120, and the RTL code will be further described later with reference to FIG. 2. However, the exemplary embodiments are not limited thereto. Further, the converter module 12 may convert the data included in the spread sheet 110 into the RTL code 130. For example, a user may design or modify a circuit of a desired form using the spread sheet 110. The converter module 12 may convert the data included in the newly designed or modified spread sheet 110 into the database 120. Also, the converter module 12 may generate a new RTL code 130 using the database 120. However, the exemplary embodiments are not limited thereto.

The interface module 14 may be used to input or output the data to the RTL auto-integration system 1. The interface module 14 may receive the data of the spread sheet format to present the received data on the spread sheet 110, and may receive modifications to a connection relationship between a first device and a second device that are included in the first circuit through the spread sheet 110.

The matching module 16 may match a first port included in the first device and a second port included in the second device to each other using a naming matching algorithm.

The converter module 12 may convert the spread sheet 110 into the RTL code 130 through a process of converting the spread sheet 110 into the database 120 using the result of the matching by the naming matching algorithm. The details of the naming matching algorithm will be described later.

FIG. 2 is a diagram illustrating a method for RTL auto-integration according to an exemplary embodiment.

Referring to FIG. 2, the method for RTL auto-integration according to an exemplary embodiment uses the spread sheet 110.

The spread sheet 110 may comprise, for example, a work book, a work sheet, and a cell, and a numeral, text, or an equation may be input to the cell of the spread sheet 110. Further, a user may directly define a function that performs a specific operation using a script-based program language that is provided from the spread sheet 110, and the function that is prepared by the user may be used in the equation of the cell.

The method for RTL auto-integration according to an exemplary embodiment may provide the database 120 based on the data input to the spread sheet 110, and generate the RTL code 130 that may be used to configure an RTL circuit by using the database 120. The RTL code 130 may include a circuit data that describes a logic circuit through a hierarchical structure using a very high speed integrated circuit (VHSIC) hardware description language (VHDL), Verilog-HDL, or other hardware technical languages.

Due to the development of large-scale integrated circuit technology that integrates a large number of logics into one chip, a system may be integrated onto one chip. In designing such a large-scale integrated circuit, higher development cost and a longer development period are required in proportion to the integrity of the circuit. To reduce a time period for developing a large-scale integrated circuit, there may exists a need to reuse an existing designed system on chip (SOC).

The method for RTL auto-integration according to an exemplary embodiment may generate the RTL code 130 using the spread sheet 110 that includes a connection relationship between circuit devices, which are directly prepared by the user. That is, a completely new circuit may be prepared using the spread sheet 110, and then the spread sheet 110 may be converted into the database 120. Next, the database 120 may be converted into the RTL code 130. This method may consume longer time in comparison to a method for using the existing SOC design, which will be described later, because the circuit should be designed using the spread sheet 110 from the beginning. However, user convenience may be increased in comparison to the method in which the RTL code 130 is directly prepared by the user, and modification may be easily performed when a similar circuit is generated. Further, when the connection relationship between a plurality of circuit devices that are included in the spread sheet 110 is designated, the RTL code 130 that reflects the connection relationship is automatically generated, and thus the probability of error occurrence may be decreased in comparison to the case where the RTL code 130 is directly prepared by the user.

The method for RTL auto-integration according to another exemplary embodiment which uses the existing SOC design, may provide the database 120 through analysis of the existing RTL code 130, and automatically generate the spread sheet 110 using the database 120. In this method, the user may modify the circuit design in a desired form using the spread sheet 110. The spread sheet 110 that is modified into a new design may be converted into the database 120. Next, a new RTL code 130 may be generated using the updated database 120. According to the method for RTL auto-integration according to another exemplary embodiment, it is possible to design a new SOC with reduced efforts using the existing SOC design.

Further, the spread sheet 110, into which the existing RTL code 130 is converted, may be reused when another SOC is designed. For example, without converting the existing RTL code 130 into the spread sheet 110, a new SOC may be designed using a frame or data of the previously converted spread sheet 110. The above-described method may be more efficient since the frame or data of the previously converted spread sheet 110 is reused. However, the exemplary embodiments are not limited thereto.

Figure 3:
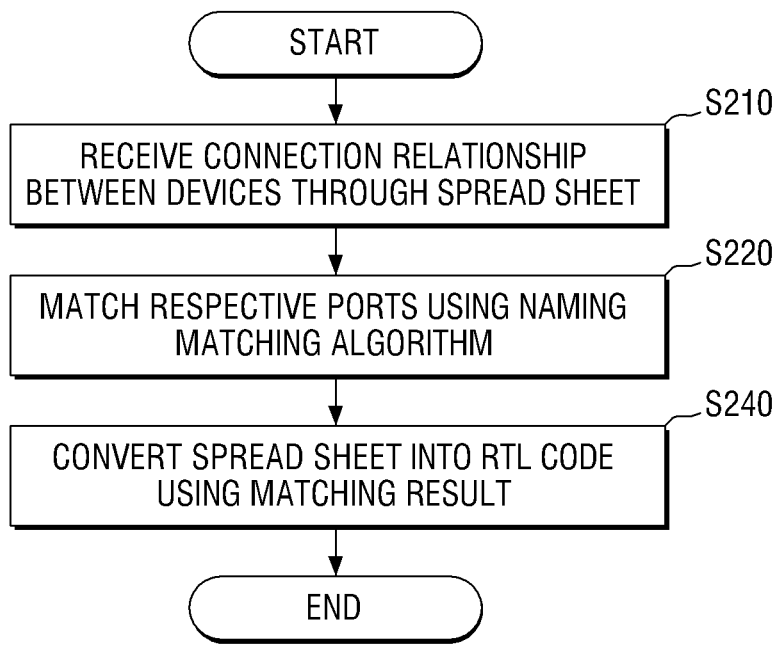
FIG. 3 is a flowchart illustrating a method for RTL auto-integration according to an exemplary embodiment.

FIG. 3 is a flowchart illustrating a method for RTL auto-integration according to an exemplary embodiment.

Referring to FIG. 3, according to a method for RTL auto-integration according to an exemplary embodiment, the connection relationship between a plurality of devices may be received through a spread sheet 110 (S210). The connection relationship between a first device and a second device may be expressed in positions of respective cells. For example, in the case of expressing the connection relationship between the first device and the second device through the spread sheet 110, a first cell, to which the first device is input, may be adjacent to a second cell to which a port name of a first port included in the first device is input. The second cell may be adjacent to a third cell to which the second device connected to the first device is input. The third cell may be adjacent to a fourth cell to which a port name of a second port included in the second device is input. In other words, the first device and the second device may be respectively connected to the first port that is included in the first device and the second port that is included in the second device. The cell to which the first device is input, the cell to which the first port is input, the cell to which the second device is input, and the cell to which the second port is input may be positioned in order in one row. That is, the adjacent cells that are input to one row may be in a connection relationship with each other.

However, the exemplary embodiments are not limited thereto. For example, adjacent cells may be positioned adjacent to one another in one column or the order of the device and the port may be changed.

Next, the first port that is included in the first device and the second port that is included in the second device may be matched to each other using a naming matching algorithm (S220). The naming matching algorithm may match the first port to the second port that has a port name most similar to a first port name of the first port. The details of the naming matching algorithm will be described later with reference to FIG. 3.

Next, the spread sheet 110 is converted into an RTL code through a process of converting the spread sheet 110 into a database 120 using the result of the matching through the naming matching algorithm (S240). In an exemplary embodiment, the RTL code 130 may correspond to an SOC design code prepared by Verilog. When a connection port between the first device and the second device that are connected in order is not designated during conversion of the RTL code 130, the name of the connection port or wire may be randomly determined. For example, when a device A and a device B are positioned adjacent to each other in one row, the connection relationship between the device A and the device B may be established. In the case of expressing the connection relationship through the RTL code 130, the user may directly designate names of the port of the device A, the port of the device B, and a wire connecting the device A and the device B. However, the exemplary embodiments are not limited thereto. For example, according to the method for RTL auto-integration according to another exemplary embodiment, the name of a port or wire for connecting the device A and the device B that is not designated may be automatically set.

The port name may be randomly determined. However, the exemplary embodiments are not limited thereto. For example, the port name may be selected from a plurality of categories according to the connection relationship. The plurality of categories may include clock, reset, bus, security, system register, interrupt, low power interface, or EMA.

Figure 4:
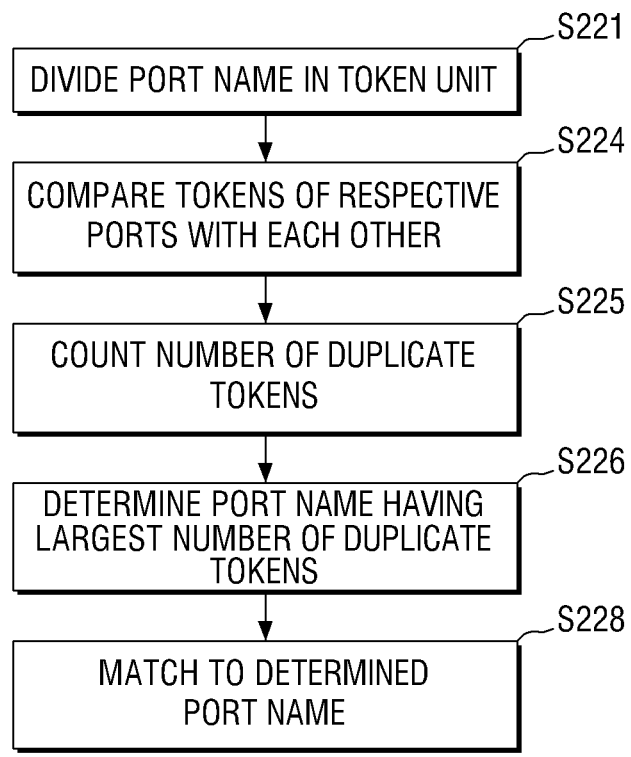
FIG. 4 is a flowchart illustrating a naming matching algorithm of a method for RTL auto-integration according to an exemplary embodiment.

FIG. 4 is a flowchart illustrating a naming matching algorithm of a method for RTL auto-integration according to an exemplary embodiment.

Referring to FIG. 4, a naming matching algorithm according to an exemplary embodiment divides the first port name and port names of respective ports included in the second device in the unit of a token (S221). Each token may be separated based on a delimiter "-" included in the port name. For example, a port name "ar_ready_s0" may be divided into tokens "ar", "ready", and "s0" based on the delimiter. However, the exemplary embodiments are not limited thereto.

Next, the token of the first port name is compared with the tokens of the respective ports included in the second device (S224). For example, when the first port name of the first device is "aready_m0", and the port names of the respective ports included in the second device are "ar_ready_s0" and "ar_resp_s0", the tokens "aready_m0" and "ar_ready_s0" may be compared with each other, and the tokens "aready_m0" and "ar_resp_s0" may be compared with each other. However, the exemplary embodiments are not limited thereto.

Then, the number of duplicate tokens is counted (S225). In the case where the first token and the second token are not completely equal to each other, but the first token is included in the second token, or vice versa, the first token and the second token may be determined as duplicate tokens. For example, when the first token is "aready" and the second token is "ready", the second token is included in the first token, and thus it may be determined that the first token and the second token are duplicate. For example, when the first port name is "aready_m0" and the port names of the respective ports included in the second device are "ar_ready_s0" and "ar_resp_s0", two duplicate tokens are counted for the port name "ar_ready_s0" since the tokens "ar" and "ready" are included in the token "aready" of the first port name, and one duplicate token is counted for the port name "ar_resp_s0" since only the token "ar" is included in the token "aready" of the first port name. However, the exemplary embodiments are not limited thereto.

Next, based on the counted number of duplicate tokens, a port name having a largest number of duplicate tokens is determined (S226). Next, the second port, which corresponds to the port name that has the largest number of duplicate tokens, is matched to the first port (S228). According to the example as described above, "ar_ready_s0" has a larger number of duplicate tokens than that of "ar_resp_s0", and thus "ar_ready_s0" of the second device may be matched to "aready_m0" of the first device.

Figure 5:
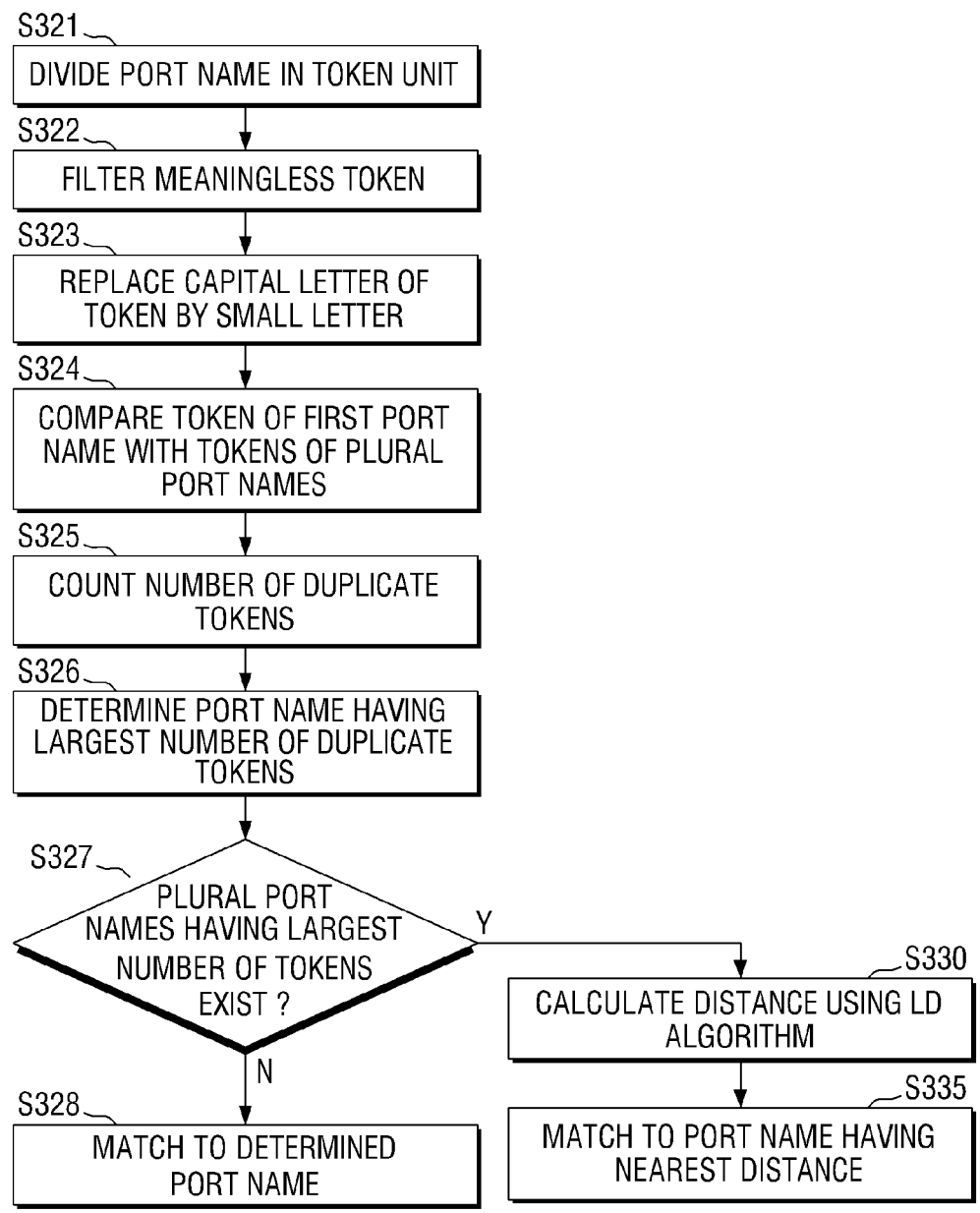
FIG. 5 is a flowchart illustrating a naming matching algorithm of a method for RTL auto-integration according to another exemplary embodiment.

FIG. 5 is a flowchart illustrating a naming matching algorithm of a method for RTL auto-integration according to another exemplary embodiment. For convenience in explanation, repetitive description will be omitted and only the differences between this embodiment and the above-described embodiment will be described.

Referring to FIG. 5, a naming matching algorithm according to another exemplary embodiment divides the first port name and port names of respective ports included in the second device in the unit of a token (S321). Next, meaningless tokens are filtered (S322). In an exemplary embodiment, preprocessing for removing tokens having one letter among the separated tokens may be performed after the port names are divided in the unit of a token. For example, when the port name is "i_ready_s0" or "o_resp_s0", "i" or "o" may be determined as a meaningless token, and may be removed through the preprocessing. However, the exemplary embodiments are not limited thereto.

Next, a capital letter included in the token may be replaced by a small letter (S323). A computer recognizes a capital letter and a small letter as different letters, and in the case of an alphabet, a task for standardizing the capital letter into the small letter may be performed before the respective tokens are compared with each other.

Next, the token of the first port name is compared with the tokens of the respective ports included in the second device (S324). Next, the number of duplicate tokens is counted (S325). Next, based on the counted number of duplicate tokens, a port name having a largest number of duplicate tokens is determined (S326).

Next, it is determined whether a plurality of port names having the largest number of duplicate tokens exist (S327). Next, when only one port name having the largest number of duplicate tokens exists (S327—'No'), the second port that corresponds to the port name having the largest number of duplicate tokens is matched to the first port (S328).

On the other hand, when a plurality of port names having the largest number of duplicate tokens exist (S327—'Yes'), similarity to the first port name of the plurality of port names having the largest number of duplicate tokens is calculated using a Levenshtein distance) algorithm. Next, the second port that corresponds to the port name having the highest similarity (i.e., port name having the shortest distance that is calculated by using the LD algorithm) is matched to the first port (S335).

FIGS. 6A and 6B are diagrams illustrating an LD algorithm of a method for RTL auto-integration according to exemplary embodiments.

The LD algorithm is a method for measuring how many operations are needed to change one character string to another character string. Specifically, when two character strings are given, the LD algorithm calculates an operation cost that is required to convert one character string into another character string. For example, in the case of measuring a distance between character strings "kitten" and "sitting", the first character 'k' of "kitten" is changed to 's' (kitten→sitten). Next, the last second character 'e' of "kitten" is changed to 'i' (sitten→sittin). Next, a character 'g' is added to the end of "sittin" (sittin→sitting). Through the above-described process, the Levenshtein distance (LD) is determined as three. However, the exemplary embodiments are not limited thereto.

Referring to FIGS. 6A and 6B, a second dimensional (2D) matrix may be used to obtain the LD value. For example, a first character string (e.g., kitten) is arranged on a first row of a 2D matrix, a second character string (e.g., sitting) is arranged on a first column of the 2D matrix, and respective values are assigned to each cell of the first and second character strings. In this matrix, the LD value may be obtained according to operations such as insertion, deletion, and replacement on at least one of the first and second character string.

In an exemplary embodiment, with respect to a cell (s, k), since 's' and 'k' of the cell (s, k) are not the same characters, the minimum value among added values of "a value of a left adjacent cell", "a value of an upper adjacent cell", "a value of an upper left adjacent cell" is input to the cell (s, k). For example, since the values of the left adjacent cell and the upper adjacent cell of the cell (s, k) are "1" and the value of the upper left cell "0", "1" is input to the cell (s, k). When the 2D matrix of FIG. 6A is assigned cell values in the same manner, a matrix as shown in FIG. 6B may be completed. The LD value may be a value of a cell (n, g) that is positioned at the right lower end corner of FIG. 6B. The detailed contents of the LD algorithm are well known in the art and thus a further detailed description thereof will be omitted.

Figure 7:
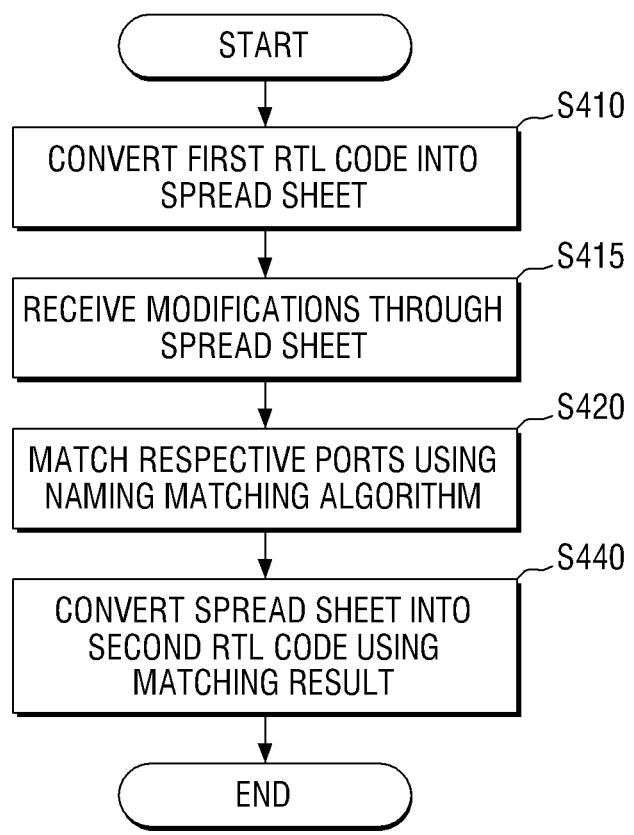
FIG. 7 is a flowchart illustrating a method for RTL auto-integration according to another exemplary embodiment.

FIG. 7 is a flowchart illustrating a method for RTL auto-integration according to another exemplary embodiment. For convenience in explanation, repetitive description will be omitted and only the differences between this embodiment and the above-described embodiment will be described.

Referring to FIG. 7, a naming matching algorithm according to still another exemplary embodiment converts a first RTL code corresponding to a first circuit into a spread sheet that indicates the connection relationship between devices included in the first circuit through a process of converting the first RTL code into a database (S410). Next, modifications to the spread sheet to generate a second circuit are received through the spread sheet (S415). The modifications to the spread sheet may include, for example, deletion of a device included in the first circuit, addition of a new device, or modification to the connection relationship between a plurality of devices included in the first circuit. However, the exemplary embodiments are not limited thereto.

Next, with respect to first and second devices included in the second circuit, a first port included in the first device and a second port included in the second device are matched to each other using a naming matching algorithm (S420). The naming matching algorithm may include methods according to exemplary embodiments as described above with reference to FIGS. 4 and 5.

Next, using the result of the matching, the converted spread sheet may be converted into a second RTL code that is different from the first RTL code (S440). The spread sheet may include rows and columns, and in the case where the first device, the second device, and a third device are positioned in order on the same row of the spread sheet, the RTL codes may be converted such that RTL codes corresponding to the first device, the second device, and the third device are positioned in the same order.

The first RTL code or the second RTL code may correspond to an SOC design code that is prepared by Verilog. However, the exemplary embodiments are not limited thereto. The spread sheet may be converted into a block diagram in which the connection relationship between the first device and the second device is visually presented and respective ports are indicated.

The spread sheet may provide the connection relationship of the existing first circuit to a user. The user may generate the second circuit that is different from the first circuit through modifying the spread sheet that reflects the existing first circuit. According to exemplary embodiments, the existing data for the first circuit is used and the connection relationship between the devices and/or ports that constitute the first circuit using the spread sheet. Accordingly, the user may easily understand the connection relationship of the first circuit, thereby improving user convenience. However, the exemplary embodiments are not limited thereto.

Figure 8:
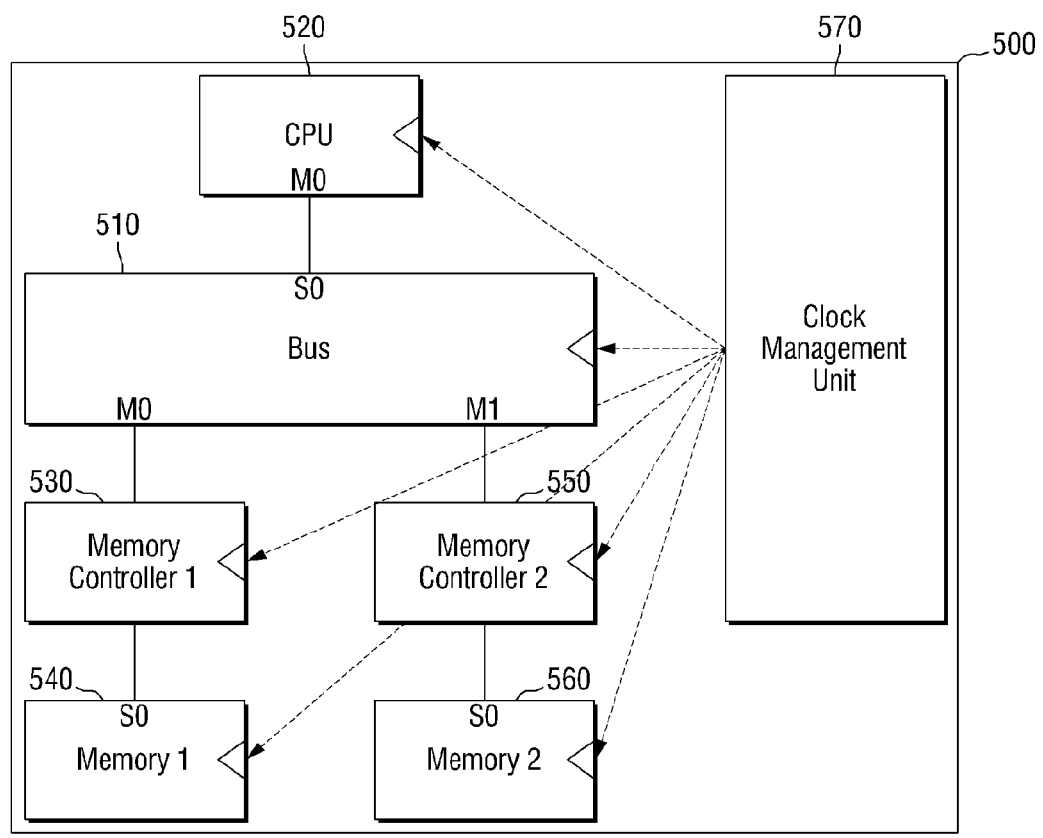
FIG. 8 is a block diagram illustrating a connection relationship between a plurality of devices according to an exemplary embodiment.

FIG. 8 is a block diagram illustrating a connection relationship between a plurality of devices according to exemplary embodiments. FIGS. 9A and 9B are diagrams illustrating spread sheets according to exemplary embodiments, and FIGS. 10A and 10B are diagrams illustrating RTL codes obtained using spread sheets in FIGS. 9A and 9B, respectively, according to an exemplary embodiment.

A block diagram 500 as shown in FIG. 8 is provided to explain arranged and systemized connection relationships between a plurality of devices included in the circuit.

Referring to FIG. 8, the block diagram 500 according to an exemplary embodiment includes a central processing unit (CU) 520, a first memory controller 530, a first memory 540, a second memory controller 550, and a second memory 560. A bus 510 may include a plurality of ports S0, M0, and M1. The bus 510 may be connected to the CPU 520 through the S0 port. The bus 510 may be connected to the first memory controller 530 through the M0 port, and may be connected to the second memory controller 550 through the M1 port. The CPU 520 may include the M0 port and may be connected to the bus 510 through the M0 port. The first memory controller 530 may be connected to the bus 510 and the first memory 540. The first memory 540 may include the S0 port and may be connected to the first memory controller 530 through the S0 port. The second memory controller 550 may be connected to the bus 510 and the second memory 560. The second memory 560 may include the S0 port and may be connected to the second memory controller 550 through the S0 port.

The block diagram 500 may further include a clock management unit 570. The clock management unit 570 may be connected to the bus 510, the CPU 520, the first memory controller 530, the first memory 540, the second memory controller 550, and the second memory 560. The clock management unit 570 may control operation timings of respective devices connected to the clock management unit

570. The clock management unit 570 may include a plurality of ports connected to the respective devices.

FIG. 9A shows a spread sheet 515 that indicates the connection states of a plurality of devices included in a first block diagram. The spread sheet 515 indicates the connection state of the bus 510. On a first column of the spread sheet 515, ports S0, M0, and M1 of the bus 510 may be recorded in order. A second column of the spread sheet 515 indicates intermediate devices connected to the bus 510. A third column of the spread sheet 515 indicates terminal devices connected to the intermediate devices of the bus 510. A fourth column of the spread sheet 515 indicates ports of the terminal devices connected to the bus 510 or the intermediate devices.

For example, the third row of the spread sheet 515 indicates that the S0 port included in the bus 510 is connected to the M0 port of the CPU 520 without the intermediate device therebetween. The fourth row of the spread sheet 515 indicates that the M0 port included in the bus 510 is connected to the S0 port of the first memory 540 through the first memory controller 530 as the intermediate device. The fifth row of the spread sheet 515 indicates that the M1 port included in the bus 510 is connected to the S0 port of the second memory 560 through the second memory controller 550 as the intermediate device. When a connection port is not designated between the first device and the second device, connected to each other in order, in the case of converting the spread sheet 515 into the RTL code, the name of the connection port may be randomly determined. However, the exemplary embodiments are not limited thereto. For example, the name of the connection port may be determined using the most similar port name in a preset port name category.

A new device may be added using the spread sheet 515. For example, a clock management unit 570 may be added to the block diagram 500.

Referring to FIG. 9B, in a spread sheet 575, a name of a device to be added, a plurality of ports included in the device to be added, destination devices to be connected to the plurality of ports, and ports included in the destination devices and to be connected to the device to be added may be adjacently arranged in order. In the spread sheet 575, each row may mean the connection relationship between the ports. For example, according to the spread sheet 515, a CLK_CPU port of the clock management unit 570 may be connected to a CLK port of the CPU 520. A CLK_BUS port of the clock management unit 570 may be connected to a CLK port of the bus 510. In the same manner, a CLK_MEM1 port of the clock management unit 570 may be connected to a CK port of the first memory 540.

When a fourth column of the spread sheet 575 is not recorded, it needs to be determined which port among the plurality of ports included in the bus 510 is to be connected to, for example, the CLK_BUS port of the clock management unit 570. According to the method for RTL auto-integration according to an exemplary embodiment, the CLK_BUS port may be connected to the port having the highest similarity among the plurality of ports included in the bus 510 using the naming matching algorithm.

For example, in the case where the bus 510 includes I_CLK, I_RESET, and O_INTERRUPT ports, tokens are generated through separation of all ports by delimiters. The CLK_BUS may be separated into CLK and BUS tokens, the I_CLK may be separated into I and CLK tokens, the I_RESET may be separated into I and RESET tokens, and the O_INTERRUPT may be separated into O and INTERRUPT tokens. Next, meaningless tokens (e.g., tokens having only one letter) are removed. In this example, I and O tokens are removed. Next, the number of duplicate tokens is counted. In this case, only the I_CLK port that includes the CLK token has one duplicate token. Accordingly, the CLK_BUS port of the clock management unit 570 is matched to the I_CLK port having the largest number of duplicate tokens in the bus 510.

When a plurality of port names having the largest number of duplicate tokens exist, a port that corresponds to the port name having the highest similarity may be connected to the port of the added device.

However, the exemplary embodiments are not limited to the matching of the port using the naming matching algorithm, but the port names on both devices connected to each other on an Excel sheet may be directly designated. Further, categories of the ports included in the respective devices may be designated, and the ports that belong to the same category may be preferentially connected to each other. For example, the category may be, for example, a clock port, reset port, bus port, security port, system register port, interrupt port, low power interface port, or EMA.

FIGS. 10A and 10B illustrate RTL codes into which the spread sheets 515 and 575 of FIGS. 9A and 9B are converted, respectively. The RTL code may correspond to an SOC design code prepared by Verilog. During conversion of the spread sheets 515 and 575 into RTL codes, the matching results obtained using the naming matching algorithm or the LD algorithm may be used.

Further, when the name of the connection port or wire between the first device and the second device that are connected in order is not designated on the spread sheet, the name of the connection port or wire may be randomly determined.

Figure 13:
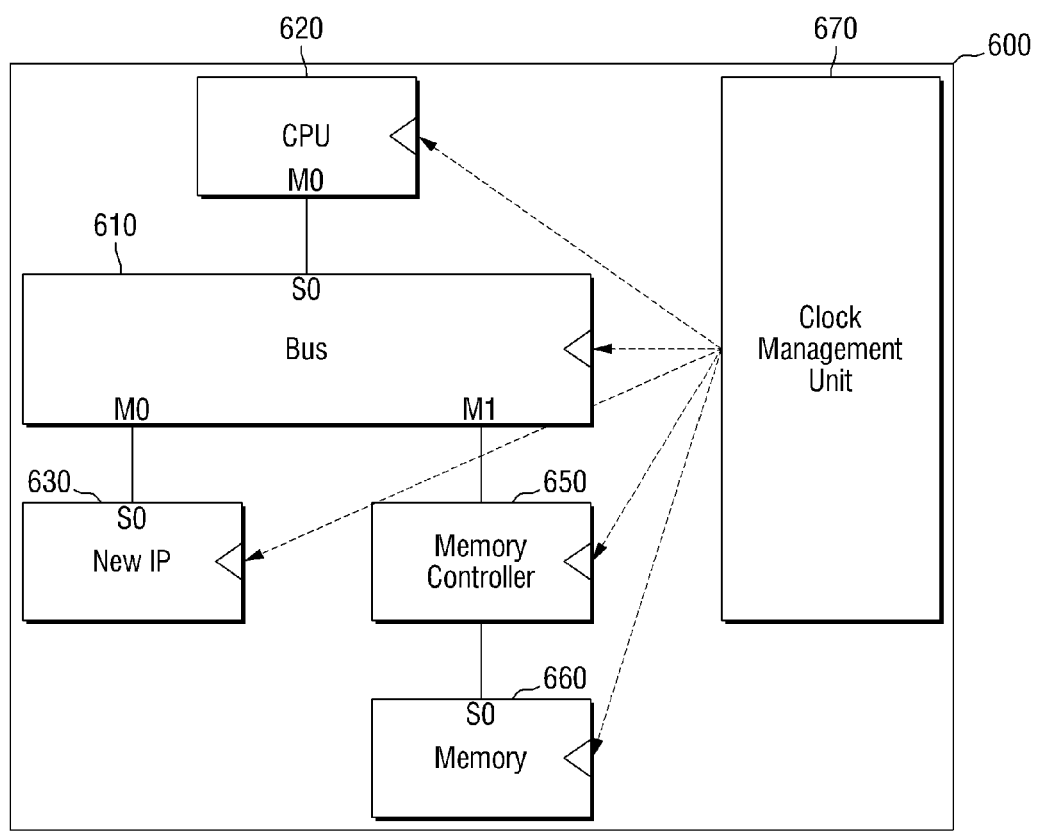
FIG. 13 is a block diagram illustrating a connection relationship between a plurality of devices according to another exemplary embodiment.

FIGS. 11A and 11B are diagrams illustrating spread sheets according to another exemplary embodiment, and FIGS. 12A and 12B are diagrams illustrating RTL codes obtained using spread sheets in FIGS. 11A and 11B, respectively, according to other exemplary embodiments. FIG. 13 is a diagram illustrating a block diagram according to other exemplary embodiments. For convenience in explanation, repetitive description will be omitted and only the differences between this embodiment and the above-described embodiment will be described.

FIGS. 11A and 11B illustrate spread sheets obtained through modifying the spread sheets 515 and 575 of FIGS. 9A and 9B. A user may generate a new circuit through modifying the spread sheets 515 and 575 that reflect the existing circuit.

For example, in FIG. 11A, as compared with FIG. 9A, the first memory controller 530 and the first memory 540 are removed, and a new device, new IP, 630 (see FIG. 13) is added. The new IP device may include an S0 port, and may be connected through an M0 port of the bus. Further, the second memory controller 550 and the second memory 560 may be modified to a memory controller 650 (see FIG. 13) and a memory 660 (see FIG. 13), respectively. However, the exemplary embodiments are not limited thereto.

FIG. 11B illustrates a spread sheet 675 that includes a clock management unit 670 (see FIG. 13). The spread sheet 675 may be modified through reflection of the modifications in FIG. 11A.

For example, a user may add the new IP device 630 and a clock port name to the spread sheet 675, and may modify the second memory controller 550 and the second memory 560 to the memory controller 650 and the memory 660, respectively. However, the exemplary embodiments are not limited thereto.

In the case where a user converts the RTL code that corresponds to the existing circuit into the spread sheet according to an exemplary embodiment, the user may not need to perform new coding of the RTL codes to generate a new circuit. Further, since the RTL codes of the previously designed circuit may be used, time and efforts for coding may be greatly reduced.

In exemplary embodiments, the configuration of the circuit is expressed by the spread sheet, and thus a user may easily understand the circuit configuration relative to a case where the RTL code is directly prepared. Since the spread sheet is automatically converted into the RTL code, less error may occur in comparison to a case where the user directly prepares the code.

FIGS. 12A and 12B illustrate RTL codes into which the spread sheets 615 and 675 of FIGS. 11A and 11B are automatically converted. The RTL code may correspond to an SOC design code prepared by Verilog.

During conversion of the spread sheets 615 and 675 into RTL codes, the matching results obtained using the naming matching algorithm or LD algorithm may be used. The RTL code of FIGS. 11A and 11B may reflect the modifications to the spread sheets 615 and 675. Further, when the name of the connection port or wire between the first device and the second device that are connected in order is not designated on the spread sheet, the name of the connection port or wire may be randomly determined.

For example, in comparing the RTL codes of FIGS. 12A and 12B with the RTL codes of FIGS. 10A and 10B, a new IP device 630 is added, and the second memory controller 550 and the second memory 560 may be modified to the memory controller 650 and the memory 660, respectively. However, the exemplary embodiments are not limited thereto.

Referring to FIG. 13, a block diagram 600 corresponds to the spread sheets 615 and 675 as described above with reference to FIGS. 11A and 11B. The spread sheets 615 and 675 may visually present the connection relationship between the first device and the second device and may be converted into the block diagram 600 that indicates respective ports.

For example, according to the block diagram 600 according to exemplary embodiments, as compared with the block diagram 500 of FIG. 8, a new IP device 630 is added, and the second memory controller 550 and the second memory 560 may be modified to the memory controller 650 and the memory 660, respectively. However, the exemplary embodiments are not limited thereto. The user may modify the circuit in various manners using the spread sheet. The corrected spread sheet may be converted into the RTL code or the block diagram.

Although preferred embodiments have been described for illustrative purposes, those skilled in the art will appreciate that various modifications, additions and substitutions are possible, without departing from the scope and spirit of the invention as disclosed in the accompanying claims.

The steps of a method or algorithm described in connection with the embodiments disclosed herein may be embodied directly in hardware, in a software module executed by a processor, or in a combination of the two. A software module may reside in a random access memory (RAM), a flash memory, a read only memory (ROM), an erasable and programmable ROM (EPROM), an electrically erasable and programmable ROM (EEPROM), registers, hard disk, a removable disk, a compact disc ROM (CD-ROM), or any other form of storage medium including a network storage medium. An exemplary storage medium may be coupled to the processor such the processor may read information from, and write information to, the storage medium. In the alternative, the storage medium may be integral to the processor. The processor and the storage medium may also reside in an application specific integrated circuit (ASIC). The ASIC may reside in a user terminal. Alternatively, the processor or the storage medium may reside in a user terminal as an individual component.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A method for register transfer level (RTL) auto-integration, the method comprising:
receiving, by using at least one processor, an input indicating a connection relationship between a first device and a second device through a spread sheet;
matching, by using the at least one processor, a first port included in the first device to a second port included in the second device using a naming matching algorithm; and
converting, by using the at least one processor, the spread sheet into an RTL code using a result of the matching,
wherein the naming matching algorithm matches the first port to the second port having a second port name most similar to a first port name of the first port.

2. The method of claim 1, wherein the receiving comprises converting an RTL code, which includes the connection relationship between the first device and the second device and corresponds to a first circuit, into the spread sheet, and
the method further comprises receiving, by using the at least one processor, an input to modify the first circuit through the spread sheet.

3. The method of claim 2, wherein the input to modify the first circuit comprises at least one of an input to delete a device included in the first circuit, an input to add a new device, and an input to modify a connection relationship between a plurality of devices included in the first circuit.

4. The method of claim 1, wherein the naming matching algorithm divides the first port name of the first port included in the first device and a plurality of second port names of respective ports included in the second device in a unit of a token, counts a number of duplicate tokens by comparing at least one first token of the first port name with at least one second token of the plurality of second port names of the respective ports included in the second device, and matches the second port, that corresponds to a port name having a largest number of the duplicate tokens, to the first port,
wherein the first port name and the plurality of second port names are divided based on a delimiter "-" that is included in the first port name and the plurality of second port names.

5. The method of claim 4, further comprising replacing, by using the at least one processor, a capital letter included in the at least one first token and the at least one second token by a small letter before performing the matching,
wherein the counting includes determining the at least one first token and the at least one second token as the duplicate tokens if the at least one first token is included in the at least one second token.

6. The method of claim 4, further comprising removing, by using the at least one processor, a token having only one letter among the at least one first token and the at least one second token after dividing the first port name and the plurality of second port names in the unit of the token.

7. The method of claim 4, wherein if second port names having the largest number of the duplicate tokens exist, the second port that corresponds to the second port name having a highest similarity is matched to the first port using a Levenshtein distance (LD) algorithm, which determines similarity between the second port names and the first port name.

8. The method of claim 1, wherein the spread sheet includes a plurality of rows and a plurality of columns, and
if the first device, the second device, and a third device are positioned in an order on a row of the spread sheet, the RTL code is converted such that the first device, the second device, and the third device are connected to one another in the same order.

9. The method of claim 8, wherein if a connection port or a connection wire is not designated between the first device and the second device during conversion of the RTL code, a name of the connection port or the connection wire is randomly determined.

10. The method of claim 1, wherein the spread sheet comprises:
a first cell to which information about the first device is input;
a second cell to which the first port name of the first port included in the first device is input, the second cell being adjacent to the first cell;
a third cell to which the second device connected to the first device is input, the third cell being adjacent to the second cell; and
a fourth cell to which the second port name of the second port included in the second device is input, the fourth cell being adjacent to the third cell.

11. The method of claim 1, further comprising converting, by using at least one processor, the spread sheet into a block diagram,
wherein the block diagram visually presents the connection relationship between the first device and the second device and indicates the first port on the first device and the second port on the second device, respectively.

12. The method of claim 1, wherein the RTL code corresponds to a system on chip (SOC) design code that is prepared by Verilog.

13. A non-transitory computer readable recording medium having recorded therein a program that, when executed by a computer, causes the computer to perform the method for RTL auto-integration of claim 1.

14. A system for register transfer level (RTL) auto-integration, the system comprising:
a processor; and
a storage configured to store an RTL auto-integration module that performs an operation using the processor, and data that is processed by the RTL auto-integration module,
wherein the RTL auto-integration module comprises:
a converter module configured to convert an RTL code corresponding to a first circuit into data of a spread sheet format or convert data included in a spread sheet into an RTL code;
an interface module configured to present the data of the spread sheet format on the spread sheet and receive an input to modify a connection relationship between a first device and a second device, which are included in the first circuit through the spread sheet; and
a matching module configured to match a first port included in the first device to a second port included in the second device using a naming matching algorithm.

15. The system of claim 14, wherein the naming matching algorithm divides a first port name of the first port included in the first device and a plurality of second port names of respective ports included in the second device in a unit of a token, counts a number of duplicate tokens by comparing at least one first token of the first port name with at least one second token of the plurality of second port names of the respective ports included in the second device, and matches the second port that corresponds to a port name having a largest number of the duplicate tokens to the first port,
wherein the first port name and the plurality of second port names are divided based on a delimiter "-" that is included therein.

16. A system for designing a circuit using register transfer level (RTL) coding, the system comprising:
at least one memory device configured to store program code; and
at least one processor configured to read the program code and operate as instructed by the program code, wherein the program code is configured to cause the at least one processor to:
convert a first RTL code corresponding to a first circuit into a spread sheet indicating a connection relationship between devices included in the first circuit; and
modify the spread sheet to correspond to a second RTL code which is different from the first RTL code.

17. The system of claim 16, wherein the program code further causes the at least one processor to automatically convert the modified spread sheet to the second RTL code.

18. The system of claim 17, wherein the program code further causes the at least one processor to convert data in the spread sheet to a database and generate the second RTL code using the database.

19. The system of claim 16, wherein the program code further causes the at least one processor to match a first port included in a first device to a second port included in a second device, the first device and the second device being included in a second circuit corresponding to the second RTL code.

20. The system of claim 19, wherein the first port has a port name most similar to a port name of the second port among a plurality of ports included in the second circuit.

* * * * *